(12) United States Patent
Kato

(10) Patent No.: US 7,446,587 B2
(45) Date of Patent: Nov. 4, 2008

(54) SEMICONDUCTOR DEVICE AND DRIVING METHOD THEREOF

(75) Inventor: Kiyoshi Kato, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/900,141

(22) Filed: Jul. 28, 2004

(65) Prior Publication Data
US 2005/0062512 A1 Mar. 24, 2005

(30) Foreign Application Priority Data
Jul. 31, 2003 (JP) ............................. 2003-283632

(51) Int. Cl.
*H03K 3/00* (2006.01)
(52) U.S. Cl. ...................... 327/293; 327/269; 327/294; 327/298
(58) Field of Classification Search ................ None
See application file for complete search history.

(56) References Cited

U.S. PATENT DOCUMENTS

| 5,043,596 | A | * | 8/1991 | Masuda et al. | ............... 327/297 |
| 5,278,457 | A | * | 1/1994 | Fujita et al. | ................. 327/237 |
| 5,280,195 | A | * | 1/1994 | Goto et al. | .................. 327/294 |
| 5,306,963 | A | | 4/1994 | Leak et al. | |
| 5,349,366 | A | * | 9/1994 | Yamazaki et al. | ............. 345/92 |
| 5,406,198 | A | | 4/1995 | Orihashi et al. | |
| 5,438,259 | A | | 8/1995 | Orihashi et al. | |
| 5,465,066 | A | * | 11/1995 | Yamashita et al. | ........... 327/294 |
| 5,523,984 | A | * | 6/1996 | Sato et al. | ...................... 368/46 |
| 5,719,514 | A | * | 2/1998 | Sato | ............................. 327/262 |
| 5,842,001 | A | | 11/1998 | Kubota | |

(Continued)

FOREIGN PATENT DOCUMENTS

JP     05-007127     1/1993

(Continued)

OTHER PUBLICATIONS

Partial English Translation of International Preliminary Examination Report (Application No. PCT/JP2004/010325) dated Sep. 14, 2004.

(Continued)

*Primary Examiner*—Kenneth B. Wells
*Assistant Examiner*—An T. Luu
(74) *Attorney, Agent, or Firm*—Eric J. Robinson; Robinson Intellectual Property Law Office, P.C.

(57) ABSTRACT

The invention provides a semiconductor device which can suppress a variation of clock signals. According to the invention, a single clock signal is divided into a plurality of clock signals and supplied to each of a plurality of circuits in a semiconductor device. Propagation delay time of each of the clock signals is not completely fixed in a design phase, but a circuit (variable delay circuit) which can appropriately change propagation delay time of a clock signal even after forming the semiconductor device is provided. By using the variable delay circuit, a variation in the propagation delay time is compensated so that a circuit provided in a subsequent stage of the variable delay circuit can operate normally on a desired condition. In specific, a phase of each clock signal is controlled.

24 Claims, 10 Drawing Sheets

U.S. PATENT DOCUMENTS

| | | | | |
|---|---|---|---|---|
| 6,134,182 | A | * | 10/2000 | Pilo et al. .................... 365/233 |
| 6,134,691 | A | * | 10/2000 | Hirasaka .................... 714/742 |
| 6,330,197 | B1 | * | 12/2001 | Currin et al. ................ 365/194 |
| 6,486,716 | B1 | * | 11/2002 | Minami et al. .............. 327/152 |
| 6,564,359 | B2 | * | 5/2003 | Saeki ........................... 716/5 |
| 6,909,417 | B2 | | 6/2005 | Washio et al. |
| 2003/0137330 | A1 | | 7/2003 | Yazawa et al. |

FOREIGN PATENT DOCUMENTS

| | | |
|---|---|---|
| JP | 06-051027 | 2/1994 |
| JP | 06-112782 | 4/1994 |
| JP | 07-248847 | 9/1995 |
| JP | 10-145350 | 5/1998 |
| JP | 2000-187533 | 7/2000 |
| JP | 2002-84170 | 3/2002 |
| JP | 2002-267725 | 9/2002 |
| JP | 2003-216271 | 7/2003 |

OTHER PUBLICATIONS

International Search Report (Application No. PCT/JP2004/010325) dated Sep. 14, 2004.

* cited by examiner

【FIG. 1】
(A)
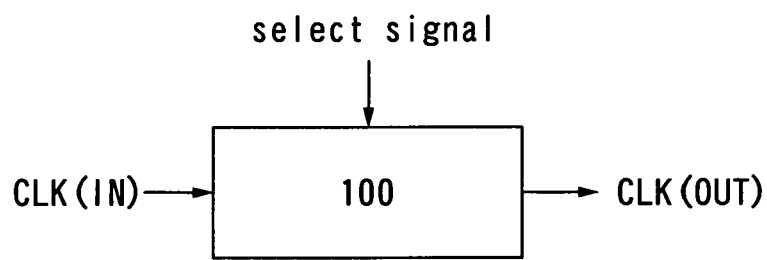
(B)
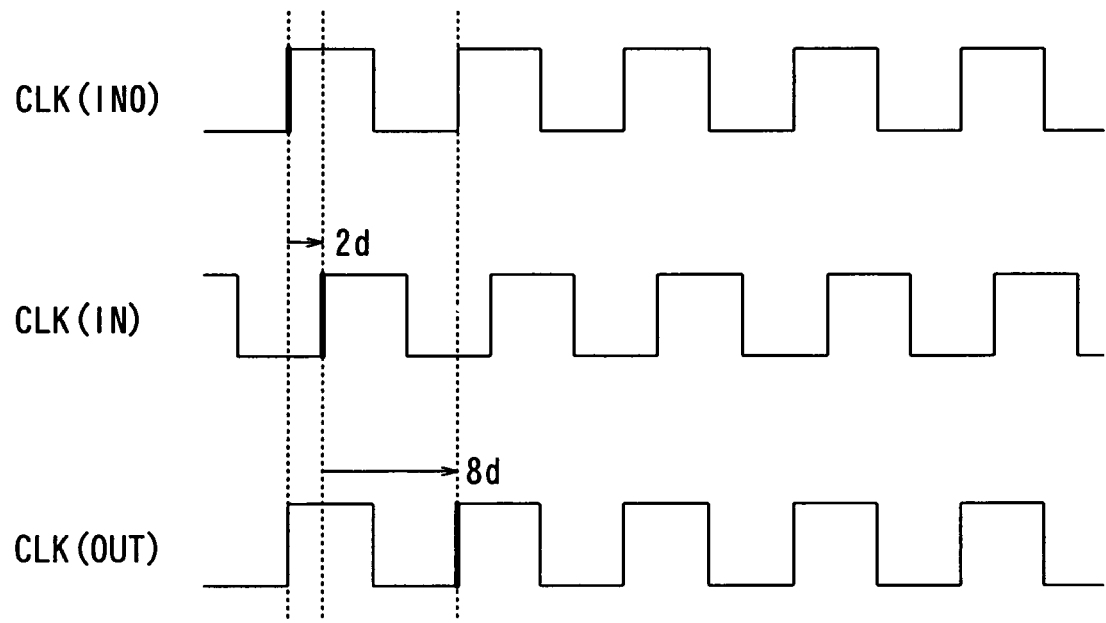

[FIG. 2]
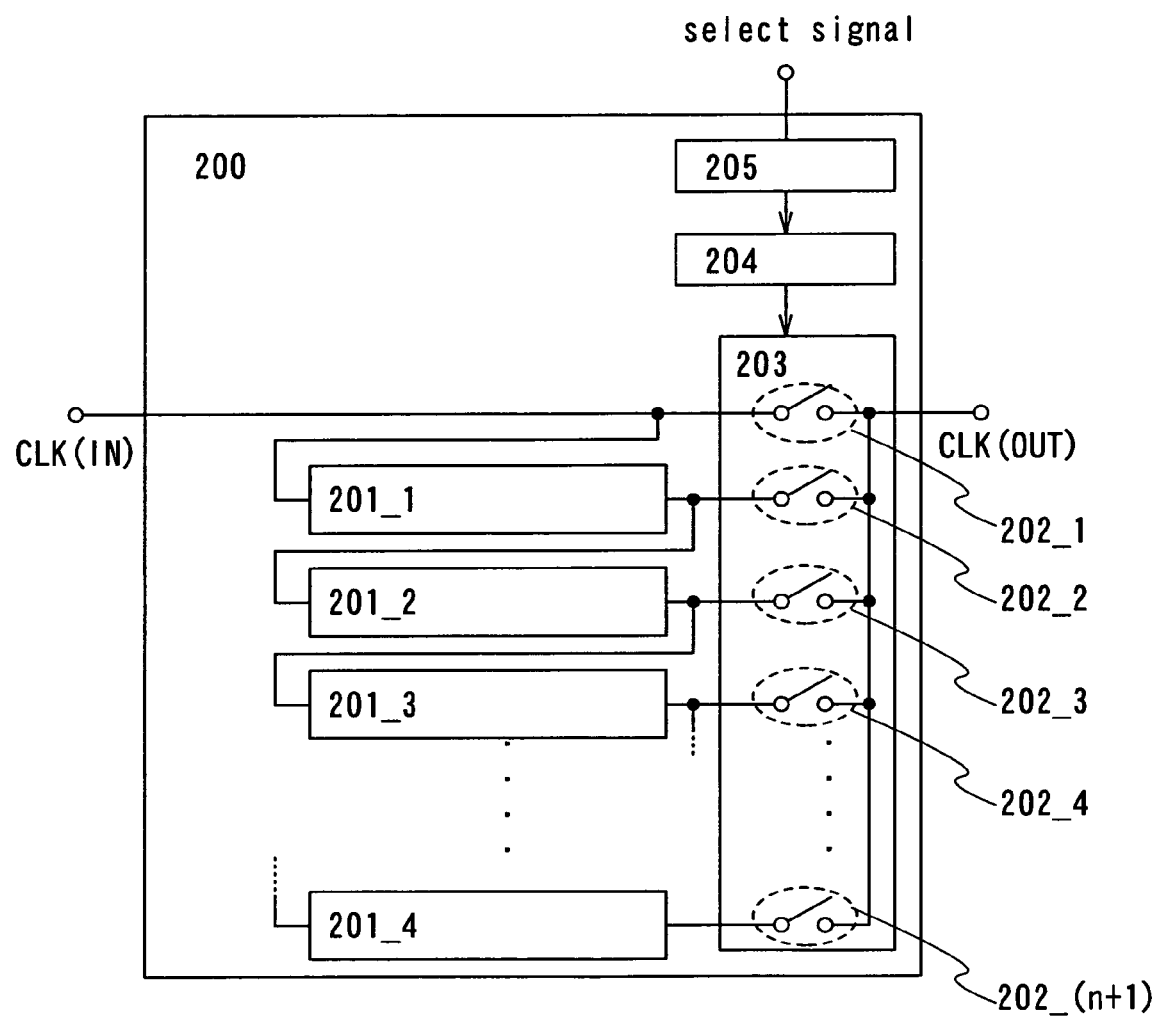

[FIG. 3]
(A)
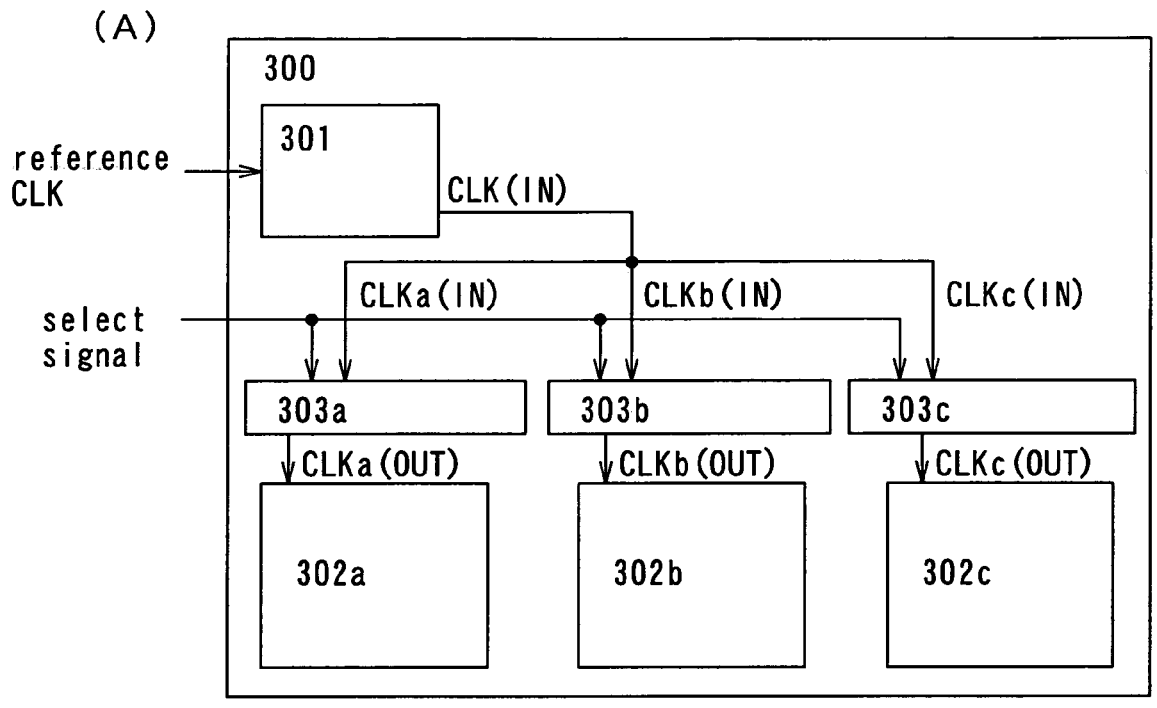
(B)
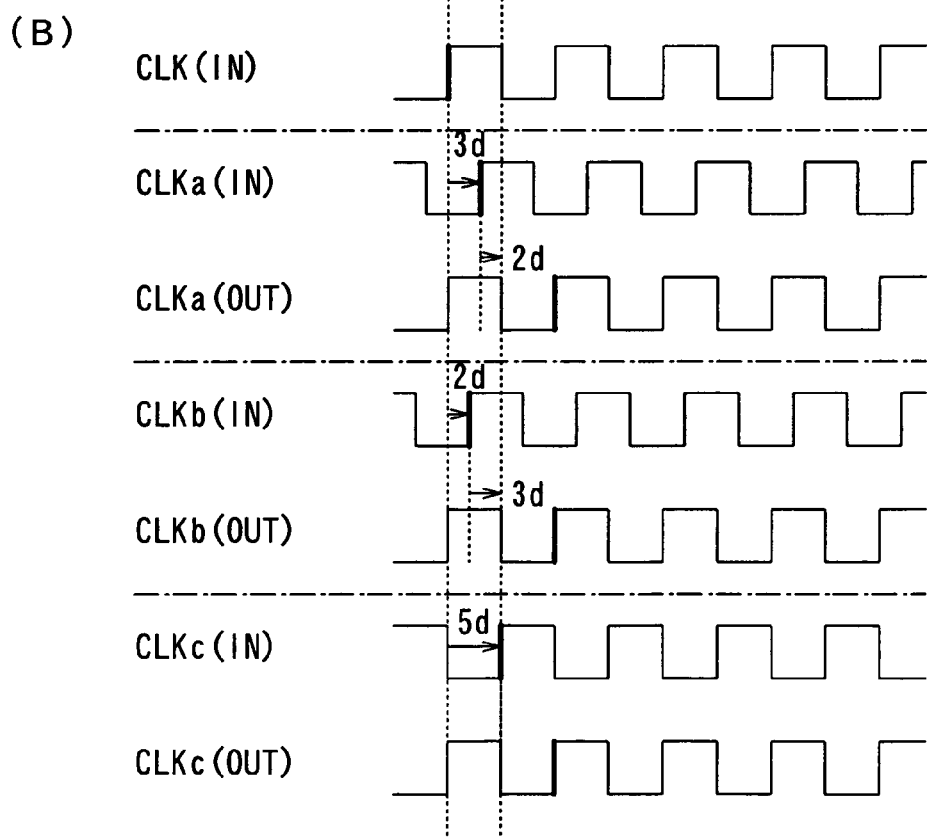

[FIG. 4]
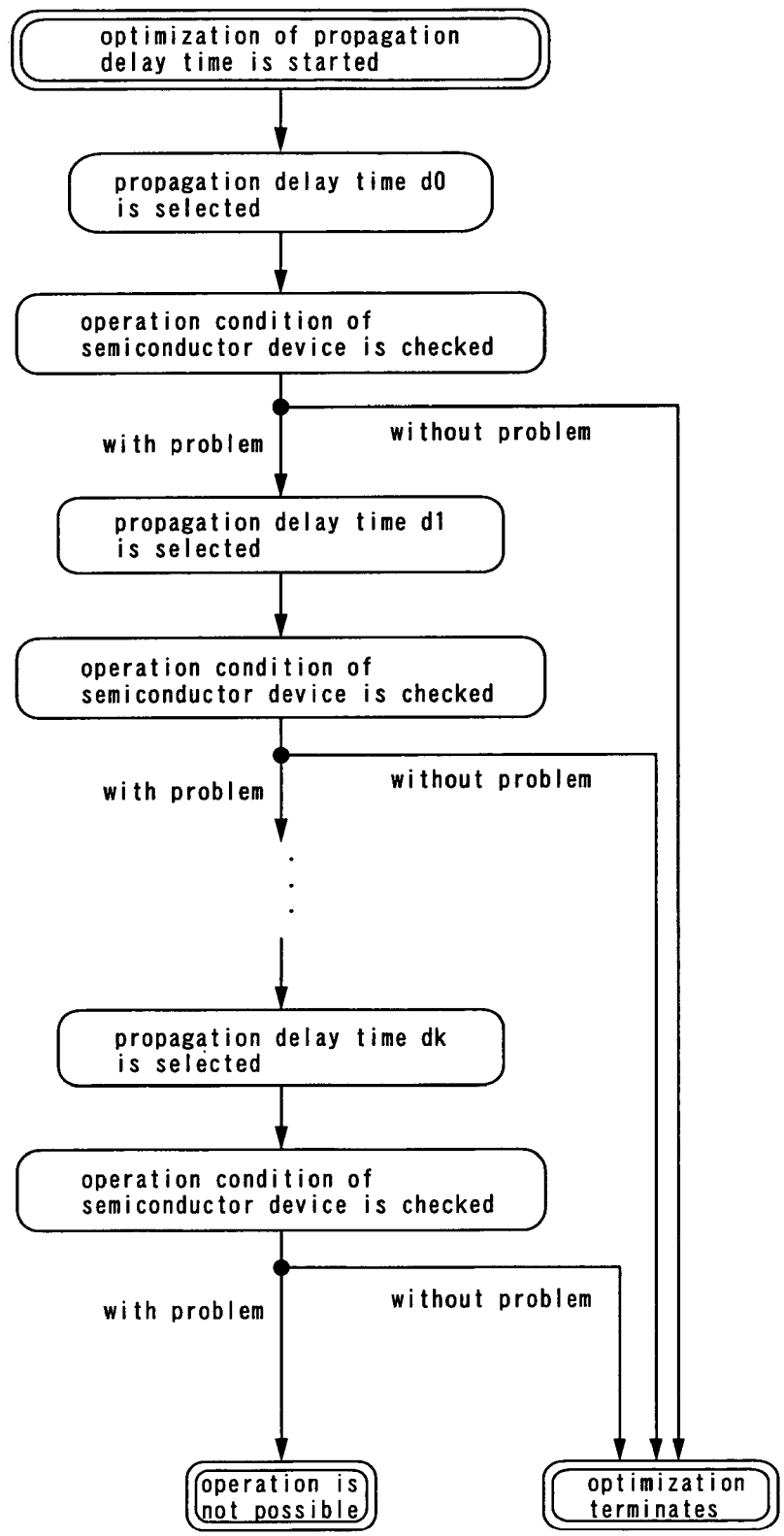

[FIG. 5]
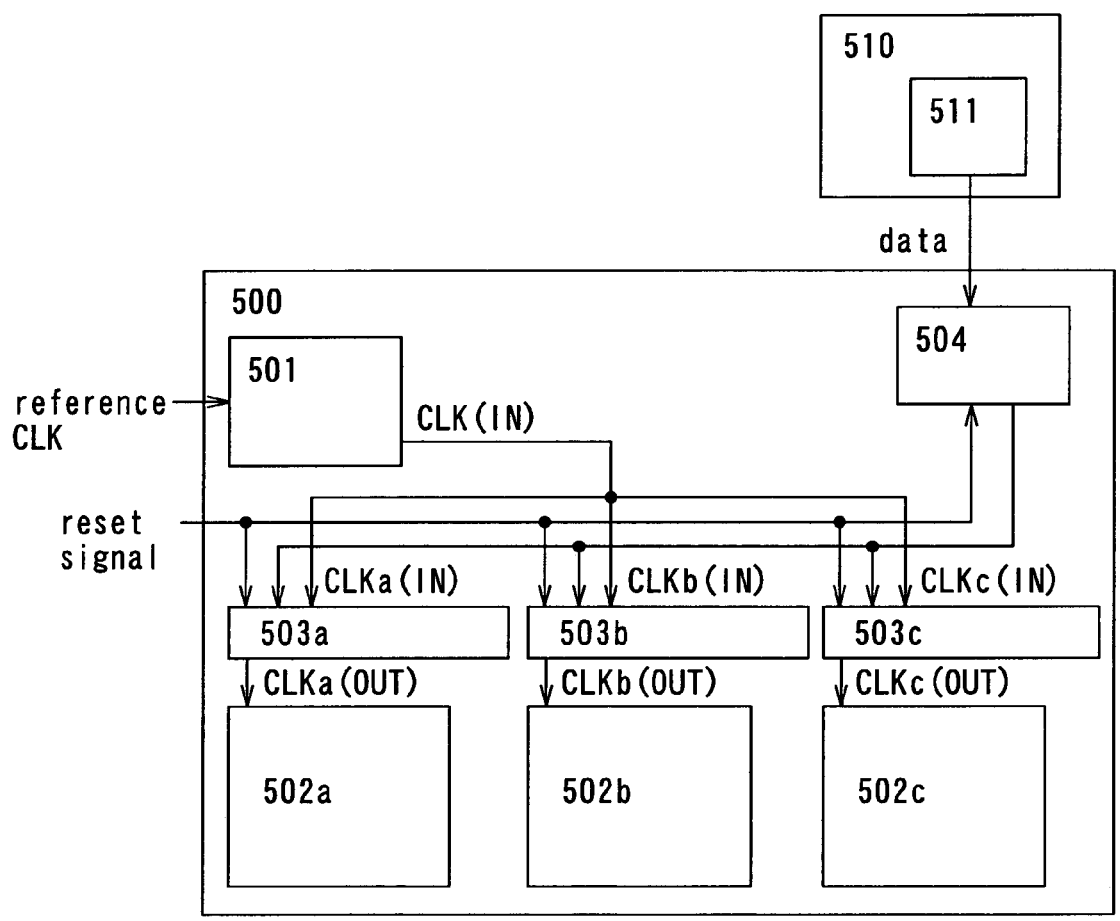

[Fig. 6]
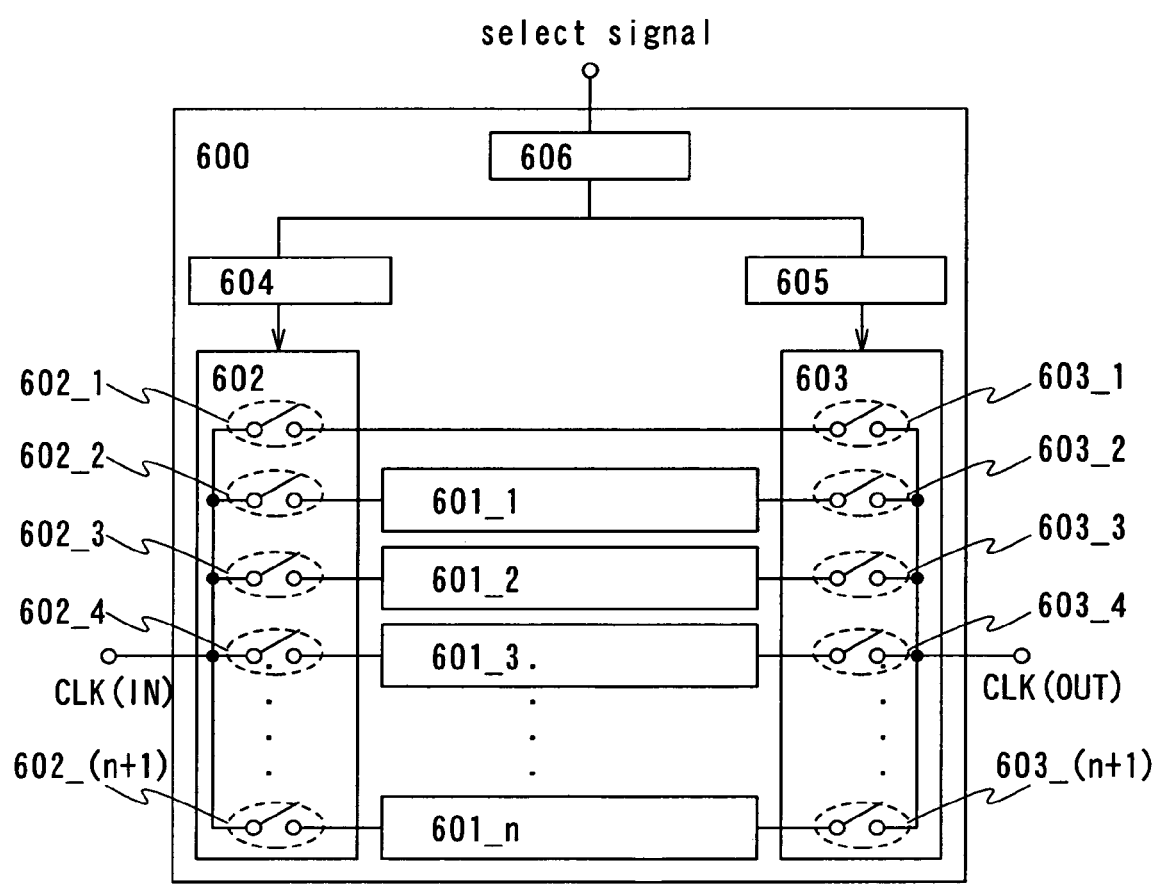

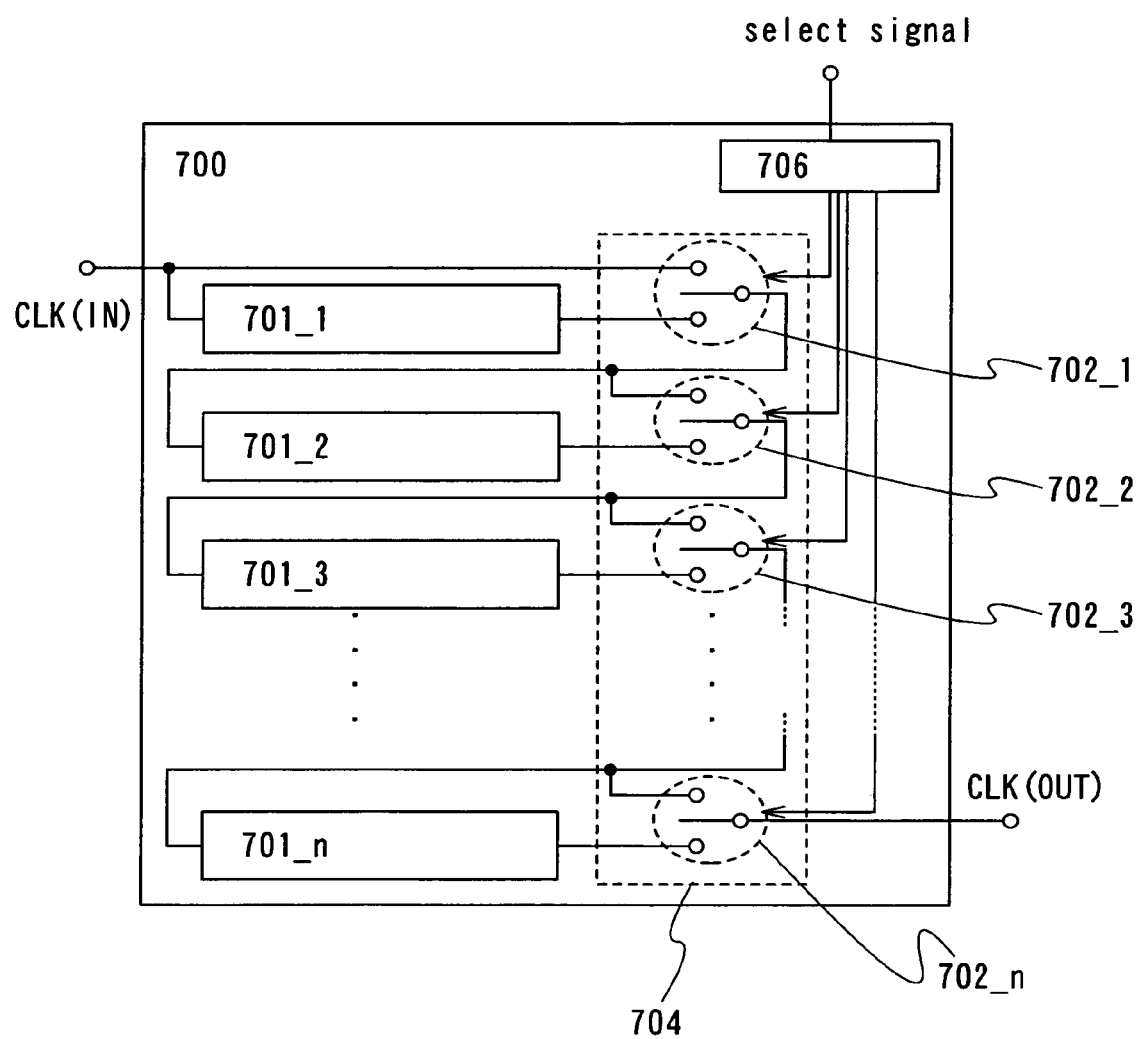
[FIG. 7]

[FIG. 8]
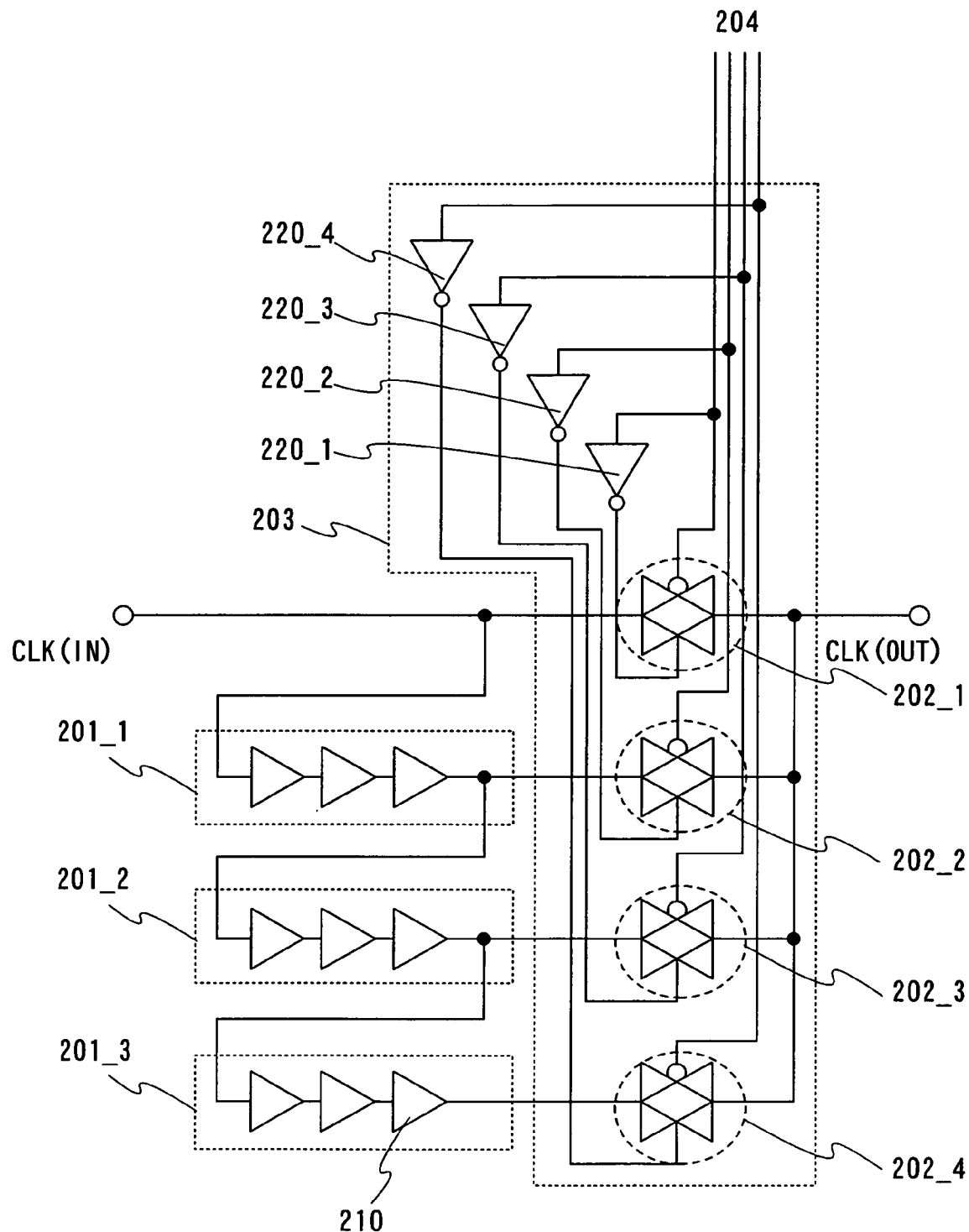

[FIG. 9]
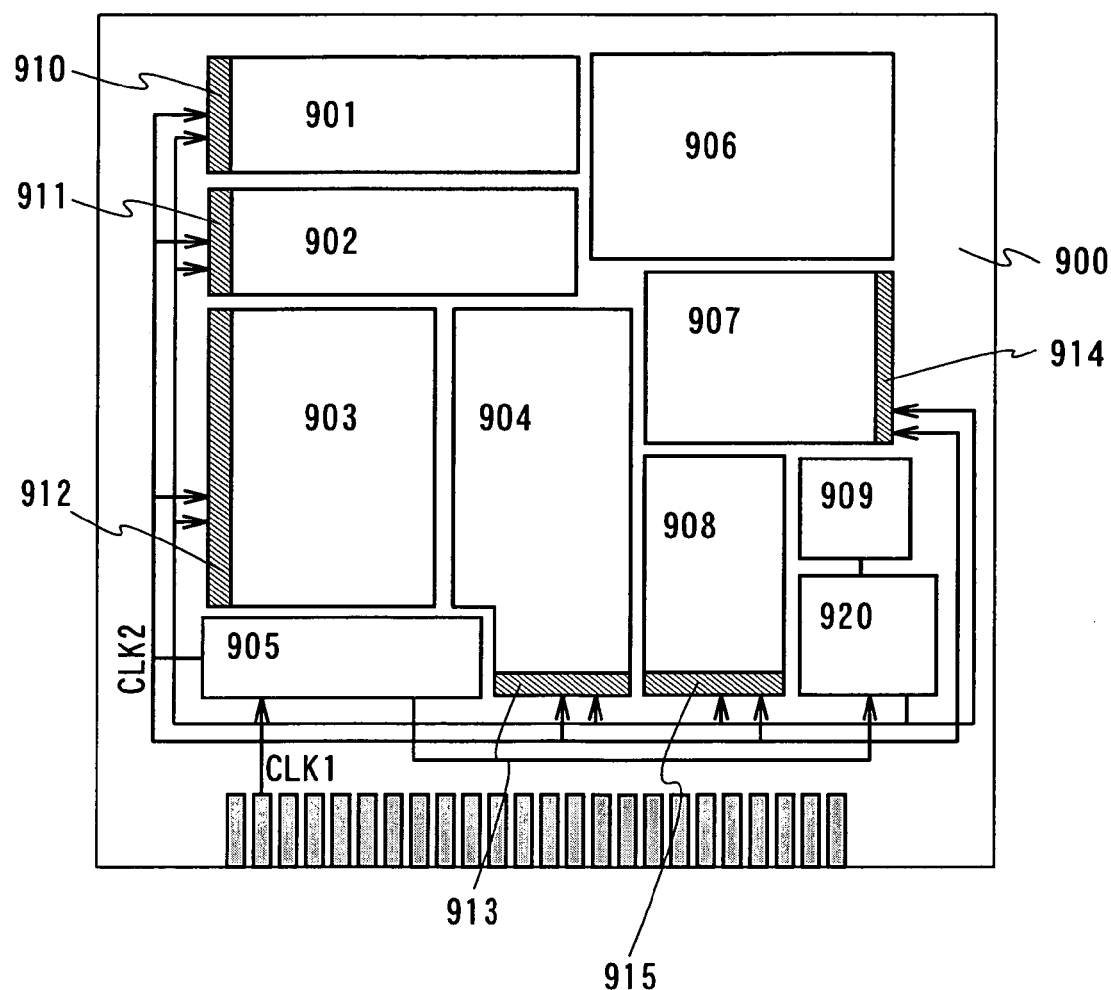

[FIG. 10]
(A) 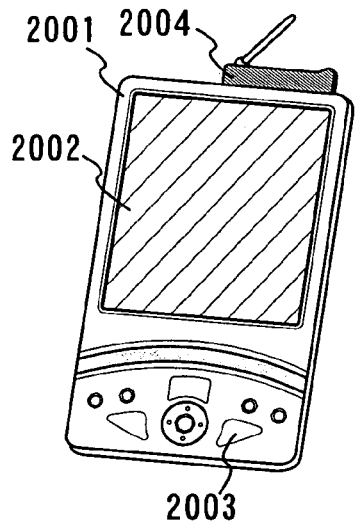
(B) 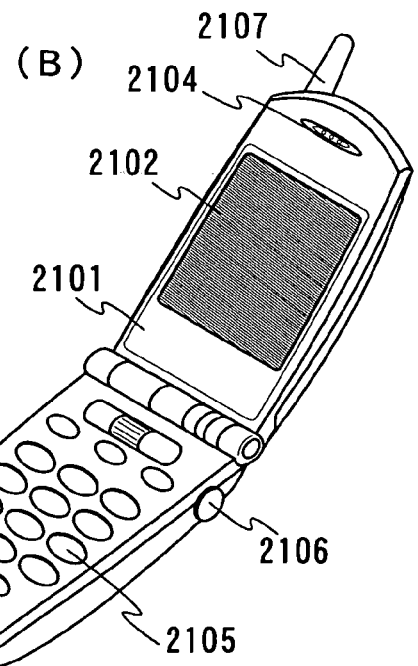
(C) 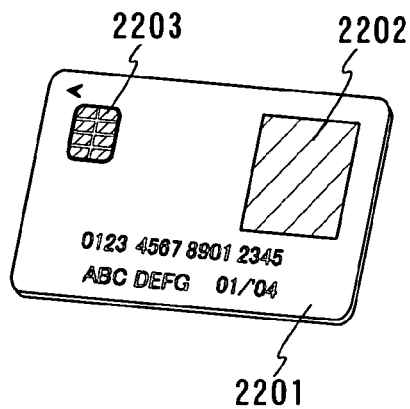
(D) 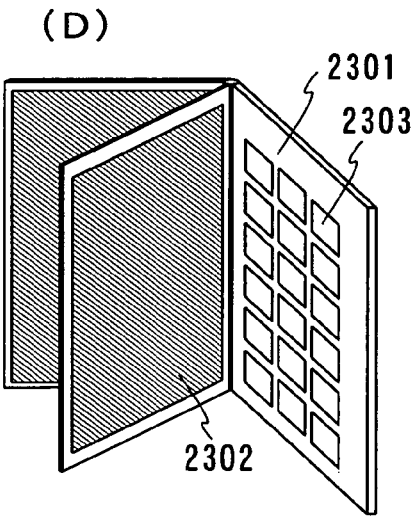
(E) 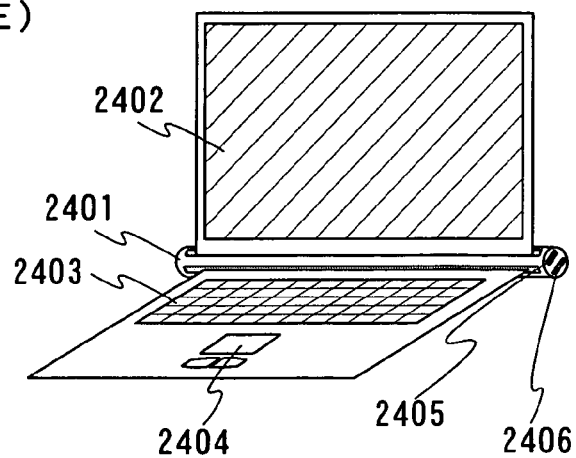

SEMICONDUCTOR DEVICE AND DRIVING METHOD THEREOF

TECHNICAL FIELD

The present invention relates to a semiconductor device provided with a function to compensate a phase shift of a clock signal due to a propagation delay and to a driving method of the semiconductor device.

BACKGROUND ART

In recent years, a technology to form an integrated circuit integrally with a pixel portion on an inexpensive glass substrate for a flat panel display, that is what is called a System On Panel is attracting attentions. In that trend, a research regarding the formation of a large scale integrated circuit using a thin film semiconductor film is also advanced. It is quite important in designing a large scale integrated circuit such as a CPU to perform not only a simulation to evaluate only a logic function but also a simulation including data such as a propagation delay caused by wiring capacitance and capacitance (gate capacitance) formed between a gate electrode and an active layer of a transistor. In the case of an integrated circuit formed by using a thin film semiconductor film, in particular, a degree of integration is lower than that of an integrated circuit formed on a single crystalline silicon wafer, therefore, wiring capacitance is not easily suppressed, thus propagation delay time of a clock signal tends to be long. Therefore, it is essential for improving the yield and ensuring the frequency characteristics to determine accurate propagation delay time in the design phase and check the operation by simulation.

A semiconductor element formed by using a thin film semiconductor film, however, easily varies in characteristics as compared to a semiconductor element formed by using a single crystalline silicon safer. Therefore, there is a problem that propagation delay time of a clock signal caused by gate capacitance also easily varies. That is, propagation delay time of a clock signal caused by the gate capacitance cannot be accurately known until actually forming an integrated circuit. Therefore, the propagation delay time cannot be determined by simulation accurately. Thus, it is difficult to realize high frequency characteristics and high yield.

As for an integrated circuit using a single crystalline silicon wafer, on the other hand, a CPU which can ensure an operating frequency of about 2 GHz is, for example, put into a practical use and advanced in higher frequency. In future, it is expected that an integrated circuit which can ensure an even higher operating frequency is realized. However, in such a high frequency operation, a variation of propagation delay time caused by a variation in characteristics of semiconductor elements is a problem even in the case of using a single crystalline silicon wafer. That is, as an operating frequency rises, a ratio of a variation of the propagation delay time to a cycle of a clock signal increases. Therefore, it is difficult to realize high frequency characteristics and high yield similarly to an integrated circuit using a thin film semiconductor film.

DISCLOSURE OF THE INVENTION

[Problem to be Solved by the Invention]

In view of the aforementioned problem, the invention provides a semiconductor device which can suppress a variation of clock signals and a driving method of the semiconductor device.

[Means for Solving the Problem]

According to the invention, a semiconductor device in which a single clock signal is divided into a plurality of clock signals and supplied to a plurality of circuits is provided with a circuit (variable delay circuit) which can appropriately change propagation delay time of a clock signal even after forming a semiconductor device, without completely fixing the propagation delay time of each of the plurality of clock signals in the design phase. By using the variable delay circuit, a variation of the propagation delay time is compensated so that a circuit provided in a subsequent stage of the variable delay circuit can operate normally on a desired condition. In specific, a phase of each clock signal is controlled.

Note that a clock signal is a control signal which determines a timing of a basic operation of a semiconductor device. A semiconductor device can perform an original function only after a clock signal is inputted. Therefore, it is normally impossible to set a balance of a propagation delay of clock signals which corresponds to a setting before a semiconductor device functions. A variable delay circuit included in the semiconductor device of the invention can control with a different system than a circuit which performs a basic operation, therefore, a propagation delay of clock signals in a semiconductor device can be balanced.

A variable delay circuit is provided with a plurality of elements (delay elements) which can delay a clock signal and a circuit (selector) provided with a switching element which can select one or a plurality of the plurality of delay elements. A clock signal inputted to the variable delay circuit is delayed by a delay element selected by a selector and a phase thereof is shifted backward and then outputted to a subsequent circuit. Then, a degree of this propagation delay is dependent upon the number of delay elements selected by the selector and propagation delay time generated by each delay element. Therefore, by determining delay elements to be selected so that a circuit provided in a subsequent stage of the selector operates normally on a desired condition, a variation of propagation delay time which could not be known in the design phase can be compensated after actually forming a semiconductor device.

Note that a signal of which variation of a propagation delay is suppressed is not limited to a clock signal in a semiconductor device of the invention. It is important to suppress a variation due to a delay between various controls signals used broadly in a chip even other than a clock signal, to which the invention can be applied.

Note that an optimal delay element to be selected can be determined by actually selecting to see an operating state of a semiconductor device. After determining a delay element to be selected, by storing data thereof in a memory and the like, an optimal delay element can be selected when operating the semiconductor device for an original purpose.

Note that an inverter, a buffer, a resistor, and the like, for example, can be used as a delay element in the invention. A logic element which can be used as a delay element is not limited to the aforementioned elements, but any element can be used which can delay a clock signal while maintaining a cycle thereof.

Note that a semiconductor device included in the scope of the invention includes all sorts of semiconductor devices such as an integrated circuit such as a micro processor and an image processing circuit, and a semiconductor display device. The semiconductor display device includes a liquid crystal display device, a light emitting device provided with a light emitting element represented by an organic light emitting element (OLED) in each pixel, a DMD (Digital Micromirror Device), a PDP (Plasma Display Panel), an FED (Field Emission Display), and other display devices having a circuit element using a semiconductor film in a driver circuit thereof.

[Effect of the Invention]

According to the aforementioned structure of the invention, a phase shift of a clock signal due to a propagation delay thereof which can not be known by simulation can be compensated after actually forming a semiconductor device, and frequency characteristics of the semiconductor device can be improved and the yield thereof can be raised.

BRIEF DESCRIPTION OF DRAWINGS

FIG. 1 shows a block diagram of a variable delay circuit and a timing chart of a clock signal of the invention.

FIG. 2 is a block diagram showing a configuration of a variable delay circuit.

FIG. 3 shows a block diagram showing a configuration of a semiconductor device and a timing chart of a clock signal of the invention.

FIG. 4 is a flow chart for optimizing propagation delay time.

FIG. 5 is a block diagram showing a configuration of the semiconductor device of the invention.

FIG. 6 is a block diagram showing a configuration of a variable delay circuit.

FIG. 7 is a block diagram showing a configuration of a variable delay circuit.

FIG. 8 is a circuit diagram of a variable delay circuit.

FIG. 9 is a block diagram of a CPU which is one of semiconductor devices of the invention.

FIG. 10 shows views of electronic apparatuses using the semiconductor device of the invention.

EXPLANATION OF REFERENCE

100 variable delay circuit, 200 variable delay circuit, 201_1 delay element, 201_2 delay element, 201_3 delay element, 201_n delay element, 202_1 switching element, 202_2 switching element, 202_3 switching element, 202_4 switching element, 202_(n+1) switching element, 203 selector, 204 decoder, 205 register, 210 buffer, 220_1 inverter, 220_2 inverter, 220_3 inverter, 220_4 inverter, 300 semiconductor device, 301 internal clock generating portion, 302a circuit A, 302b circuit B, 302c circuit C, 303a variable delay circuit, 303b variable delay circuit, 303c variable delay circuit, 500 chip, 501 internal clock generating portion, 502a circuit A, 502b circuit B, 502c circuit C, 503a variable delay circuit, 503b variable delay circuit, 503c variable delay circuit, 504 ROM I/F, 510 chip, 511 ROM, 600 variable delay circuit, 601_1 delay element, 601_2 delay element, 601_3 delay element, 601_n delay element, 602 selector, 602_1 switching element, 602_2 switching element, 602_3 switching element, 602_4 switching element, 602_(n+1) switching element, 603 selector, 603_1 switching element, 603_2 switching element, 603_3 switching element, 603_4 switching element, 603_(n+1) switching element, 604 decoder, 605 decoder, 606 register, 700 variable delay circuit, 701_1 delay element, 701_2 delay element, 701_3 delay element, 701_n delay element, 702_1 switching element, 702_2 switching element, 702_3 switching element, 702_n switching element, 704 selector, 706 register, 900 substrate, 901 ALU, 902 ALU Controller, 903 Instruction Decoder, 904 Interrupt Controller, 905 Timing Controller, 906 Register, 907 Register Controller, 908 Bus I/F, 909 ROM, 910 variable delay circuit, 911 variable delay circuit, 912 variable delay circuit, 913 variable delay circuit, 914 variable delay circuit, 915 variable delay circuit, 920 ROM I/F, 2001 main body, 2002 display portion, 2003 operating key, 2004 modem, 2101 main body, 2102 display portion, 2103 audio input portion, 2104 audio output portion, 2105 operating key, 2106 external connecting port, 2107 antenna, 2201 main body, 2202 display portion, 2203 connecting terminal, 2301 main body, 2302 display portion, 2303 operating key, 2401 main body, 2402 display portion, 2403 keyboard, 2404 touch pad, 2405 external connecting port, 2406 power plug

BEST MODE FOR CARRYING OUT THE INVENTION

An operation of a variable delay circuit provided in the semiconductor device of the invention is described with reference to FIG. 1. As shown in FIG. 1A, a variable delay circuit 100 is inputted with a select signal which can control propagation delay time by selecting a delay element, and a clock signal CLK (IN) before compensation. The variable delay circuit 100 outputs a clock signal CLK (OUT) controlled in the propagation delay time by the select signal. The propagation delay time controlled by the select signal is determined by a time difference or phase difference between a clock signal CLK (INO) which has an ideal phase for operating the semiconductor device on a desired operating condition, and a clock signal CLK (IN) which is actually obtained after forming the semiconductor device.

The time differences among the ideal clock signal CKL (INO), the clock signal CLK (IN) which is actually obtained after forming a semiconductor device, and the clock signal CLK (OUT) after compensated by the variable delay circuit 100 are described with reference to the timing chart shown in FIG. 1B. As shown in FIG. 1B, it is assumed that a cycle of the clock signal CLK (INO) in the design phase of the semiconductor device is $10d$ for example and a time difference between the clock signal CLK (INO) and the clock signal CLK (IN) which is actually obtained after forming the semiconductor device is $2d$. That is, it is assumed that an edge of the clock signal CLK (IN) rises at a timing that the propagation delay time $2d$ passes after an edge of the clock signal CLK (IN0) rises.

In this case, in order to synchronize rising edges of the clock signal CLK (OUT) outputted from the variable delay circuit 100 and the ideal clock signal CLK (INO), the inputted clock signal CLK (IN) is to be delayed in the variable delay circuit 100 by time obtained by subtracting the propagation delay time $2d$ which is actually generated from the cycle $10d$, that is ($10d-2d=8d$). According to the aforementioned structure, the clock signal CLK (OUT) outputted form the variable delay circuit 100 delays by exactly 1 cycle as compared to the ideal clock signal CLK (INO), therefore, the rising edges thereof are synchronized as a result.

Note that the rising edges are most preferably synchronized completely, however, they are to be synchronized so long as the semiconductor device operates on a desired condition.

A settable range of the propagation delay time can be set, for example, a range where a semiconductor device is supposed to operate accurately in the design phase. That is, it is preferable to design the range of the propagation delay time so that a variation in the propagation delay time generated in the manufacture can be covered.

A control of the propagation delay time in the variable delay circuit is determined by a delay element selected by a select signal. FIG. 2 shows one mode of a specific configuration of a variable delay circuit 200 provided in the semiconductor device of the invention. The variable delay circuit 200 shown in FIG. 2 includes delay elements 201_1 to 201_n, a selector 203 provided with switching elements 202_1 to 202_(n+1) for selecting one or a plurality of the delay elements, a decoder 204 which decodes a select signal for selecting one of the switching elements 202_1 to 202_(n+1) and supply it to the selector 203, and a register 205 for storing the select signal in the variable delay circuit 200.

The selector 203 can select the delay elements 201_1 to 201_n according to the select signal. Note that the register 205 for storing the select signal is not necessarily provided in the variable delay circuit 200 and a register provided separately from the variable delay circuit may substitute as well. The register 205 may be initialized by a reset signal before the select signal is inputted to the register 205.

When one of the switching elements 202_1 to 202_(n+1) is selected to be turned ON by the inputted select signal, a clock signal (IN) is delayed by the delay element selected by the switching elements 202_1 to 202_(n+1) and supplied as a clock signal CLK (OUT) to a subsequent circuit of the variable delay circuit 200. Note that propagation delay time obtained by the delay elements 201_1 to 201_n is assumed to be $\sigma_1$ to $\sigma_n$ respectively.

Provided that the switching element 202_1 provided on an input side of the delay element 201_1 is selected, all the delay elements are not selected. Therefore in this case, the propagation delay time $d_0$ is ideally 0 and an inputted clock signal CLK (IN) is outputted as a clock signal CLK (OUT) as it is. Moreover, when the switching element 202_2 on an output side of the delay element 201_1 is selected, the delay element 201_1 is selected and the propagation delay time $d_1$ is ideally $\sigma_1$. Moreover, when the switching element 202_3 on an output side of the delay element 201_2 is selected, the delay element 201_1 and the delay element 201_2 are selected and the propagation delay time $d_2$ is ideally $\sigma_1+\sigma_2$.

In this manner, controlling the selection of the switching elements 202_1 to 202_(n+1) can control the propagation delay time to be $d_0$ to $d_n$ as shown in Chart 1 below.

CHART 1

| | |
|---|---|
| $d_0$ | 0 |
| $d_1$ | $\sigma_1$ |
| $d_2$ | $\sigma_1 + \sigma_2$ |
| $d_3$ | $\sigma_1 + \sigma_2 + \sigma_3$ |
| . | . |
| . | . |
| . | . |
| $d_n$ | $\sigma_1 + \sigma_2 + \sigma_3 + \ldots + \sigma_n$ |

It is to be noted that some propagation delays are caused by wiring capacitance and gate capacitance actually, therefore, an error may occur in the propagation delay time shown in Chart 1. In the case of performing compensation including the aforementioned error also, controlling the selection of the delay elements 201_1 to 201_n can compensate to some extent.

Note that a plurality of circuits which operate in accordance with the same clock signal CLK are provided in an actual semiconductor device. A difference of propagation delay time of the clock signal CLK between the plurality of circuits becomes a problem when actually operating the semiconductor device. FIG. 3A is a block diagram showing one mode of the semiconductor device of the invention.

A semiconductor device 300 is inputted with a reference clock signal CLK of which frequency, amplitude and the like are converted to specific values in an internal clock generating portion 301 and supplied to a circuit A 302a, a circuit B 302b, and a circuit C 302c as a clock signal CLK (IN) respectively.

The semiconductor device 300 is provided with variable delay circuits 303a, 303b, and 303c which correspond to the circuit A 302a, the circuit B 302b, and the circuit C 302c respectively.

Note that the frequency, amplitude and the like of the reference clock signal CLK are converted to specific values in the internal clock generating portion 301 in FIG. 3A, however, the semiconductor device of the invention is not limited to this configuration. The inputted reference clock signal CLK may be supplied to the circuit A 302a, the circuit B 302b, and the circuit C 302c respectively as a clock signal CLK (IN) as it is.

It is assumed that a clock signal CLK (IN) outputted from the internal clock generating portion 301 is inputted to variable delay circuits 303a, 303b, and 303c as a clock signal CLKa (IN), a clock signal CLKb (IN), and a clock signal CLKc (IN) which have different phases from each other due to a variation in the propagation delay time.

FIG. 3B is a timing chart of each clock signal. As shown, it is assumed that a cycle of the clock signal CLK (IN) is $10d$, and the propagation delay time of $3d$ for the clock signal CLKa (IN), $2d$ for the clock signal CLKb (IN), and $5d$ for the clock signal CLKc (IN) are generated each with respect to the clock signal CLK (IN).

The rising edges of the clock signal CLKa (OUT), the clock signal CLKb (OUT), and the clock signal CLKc (OUT) are not required to be synchronized with the rising edge of the clock signal CLK (IN), but required to be synchronized so that they are acceptable to each other. Therefore, the clock signal CLKa (IN) and the clock signal CLKb (IN) are to be delayed in accordance with the clock signal CLKc (IN) which delays the longest.

Accordingly, the variable delay circuit 303a delays the clock signal CLKa (IN) only by $2d$ and supplies it as a clock signal CLKa (OUT) to a subsequent circuit A 302a. Similarly, the variable delay circuit 303b delays the clock signal CLKb (IN) by $3d$ and supplies it as a clock signal CLKb (OUT) to a subsequent circuit B 302b. In the variable delay circuit 303c, the clock signal CLKc (IN) is supplied to a subsequent circuit C 302c as a clock signal CLKc (OUT) as it is.

According to the aforementioned configuration, rising edges of the clock signal CLKa (OUT), the clock signal CLKb (OUT), and the clock signal CLKc (OUT) are all synchronized. As described above, the rising edges are most preferably synchronized completely, but they may be synchronized so long as the semiconductor device operates on a desired condition.

Next, a method for optimizing the propagation delay time which is controlled by a variable delay circuit is described.

FIG. 4 is a flow chart showing a flow of optimization of the propagation delay time. When optimization of the propagation delay time is started, one propagation delay time is selected by a select signal first. Here, it is assumed that the shortest propagation delay time $d_0$ is selected. Then, in accordance with a clock signal CLK which is delayed by the propagation delay time $d_0$, the semiconductor device operates on a desired operating condition. At this time, in the case where the semiconductor device operates without any problem, the optimization terminates and the propagation delay time of the variable delay circuit is determined to be $d_0$. In the case where there is a problem, propagation delay time $d_0$, which is longer than $d_0$ is selected.

Similarly, the semiconductor device operates on a desired operating condition in accordance with a clock signal CLK which is delayed by the propagation delay time $d_1$. At this time, in the case where the semiconductor device operates without any problem, the optimization terminates and the propagation delay time of the variable delay circuit is determined to be $d_1$. In the case where there is a problem, propagation delay time $d_2$ which is longer than $d_1$ is selected and the aforementioned operation is repeated again.

In the case where there is still a problem in the operation of the semiconductor device even after selecting all the propagation delay time, it is determined that the operation is not possible on this operating condition. In such a case, the operation can in some cases be obtained after optimizing the propagation delay time of another variable delay circuit and then optimizing the propagation delay time of the variable delay circuit in question again.

With the propagation delay time being obtained by the optimization, a select signal for selecting the aforementioned propagation delay time may be stored in a register and the like in the variable delay circuit.

Note that the optimization of the propagation delay time can be performed before or after the shipment of the semiconductor device as a product. In the former case, it is required that a non-volatile memory storing data of the optimal propagation delay time is provided in the semiconductor device. In the latter case, the optimization may be performed automatically at a predetermined timing such as when turning on the power, or may be performed manually by a user.

FIG. 5 is a block diagram showing one mode of the semiconductor device of the invention to read data for setting the propagation delay time from a non-volatile memory in the variable delay circuit. In FIG. 5, a chip 500 includes an internal clock generating portion 501, a circuit A 502a, a circuit B 502b, a circuit C 502c, variable delay circuits 503a, 503b, and 503c which correspond to each of the circuit A 502a, the circuit B 502b, and the circuit C 502c, and an interface for a ROM (ROM I/F) 504.

A chip 510 is provided with a ROM 511. The ROM 511 stores data of propagation delay time used in the variable delay circuits 503a, 503b, and 503c, and data of the delay elements selected in the variable delay circuits 503a, 503b, and 503c.

A read-in operation from the ROM 511 is automatically performed after or as a part of a reset operation of the chip 500. The data including data of select signals corresponding to each variable delay circuit 503a, 503b, and 503c are read out from the ROM 511 and written to registers in the variable delay circuits 503a, 503b, and 503c through the ROM I/F 504, respectively. At the time of the reset operation, the registers in the variable delay circuits may be initialized before reading in from the ROM 511.

In the variable delay circuits 503a, 503b, and 503c, selectors operate in accordance with the data stored in the registers, thus the propagation delay time can be set.

Embodiment 1

In this embodiment, one mode of the variable delay circuit of the invention is described. FIG. 6 is a block diagram showing a configuration of a variable delay circuit of this embodiment. A variable delay circuit 600 of this embodiment includes delay elements 601_1 to 601_n, a selector 602 provided with switching elements 602_1 to 602_(n+1) for selecting the delay elements, and a selector 603 provided with switching elements 603_1 to 603_(n+1) for selecting the delay elements. The variable delay circuit 600 of this embodiment includes a decoder 604 which decodes a select signal for selecting one of the switching elements 602_1 to 602_(n+1) and supplies to the selector 602, and a decoder 605 which decodes a select signal for selecting one of the switching elements 603_1 to 603_(n+1) and supplies it to the selector 603, and a register 606.

The delay elements 601_1 to 601_n can be selected in accordance with a select signal by the selectors 602 and 603.

Note that the register 606 for storing the select signal is not necessarily provided in the variable delay circuit 600, but a register provided separately from the variable delay circuit 600 may substitute as well.

When a select signal is inputted to the variable delay circuit 600, the select signal is written to the register 606. The register 606 may be initialized by a reset signal before the select signal is written to the register 606. The select signal written to the register 606 is supplied to the decoders 604 and 605. The decoders 604 and 605 decode the select signal and supplies it to the selectors 602 and 603. According to the decoded select signal, the switching elements in the selectors 602 and 603 are selected.

At this time, the switching elements selected in the selectors 602 an 603 are connected in series with each other and may interpose each of the delay elements 601_1 to 601_n between them. In the case where the switching element 602_1 is selected, for example, the switching element 603_1 connected in series is selected and an inputted clock signal CLK (IN) is supplied to a subsequent circuit as a clock signal CLK (OUT) directly without passing a delay element. Accordingly, the propagation delay time $d_0$ is ideally 0 in this case. In the case where the switching element 602_2 is selected, the switch 603_2 connected in series interposing the delay element 601_1 is selected and the propagation delay time $d_1$ is ideally determined to be $\sigma_1$ by the delay element 601_1. Thus an inputted clock signal CLK (IN) is supplied to a subsequent circuit as a clock signal CLK (OUT) which is delayed by $\sigma_1$.

In this manner, controlling the selections of the switching elements 602_1 to 602_(n+1) and the switching elements 603_1 to 603_(n+1) can control the propagation delay time to be $\sigma_1$ to $\sigma_n$ as shown in Chart 2 below.

CHART 2

| | |
|---|---|
| $d_0$ | 0 |
| $d_1$ | $\sigma_1$ |
| $d_2$ | $\sigma_2$ |
| $d_3$ | $\sigma_3$ |
| . | . |
| . | . |
| . | . |
| $d_n$ | $\sigma_n$ |

In this embodiment, the selectors are provided on both input and output sides of the delay elements 601_1 to 601_n, however, a selector may be provided on only the output side.

Embodiment 2

In this embodiment, one mode of the variable delay circuit of the invention is described. FIG. 7 is a block diagram showing a configuration of the variable delay circuit of this embodiment. A variable delay circuit 700 of this embodiment includes delay elements 701_1 to 701_n and a selector 704 for selecting the delay elements. The selector 704 includes switching elements 702_1 to 702_n. The variable delay circuit 700 of this embodiment includes a register 706 for storing a select signal for selecting the switching elements 702_1 to 702_n.

Note that the register 706 for storing the select signal is not necessarily provided in the variable delay circuit 700 and a register provided separately from the variable delay circuit 700 may substitute as well.

In this embodiment, one of an input side and an output side of each of the delay elements 701_1 to 701_n is selected by each switching element 702_1 to 702_n and connected to an input side of a subsequent delay element or an output side of the variable delay circuit 700. According to the aforementioned configuration, a plurality of the delay elements 701_1 to 701_n can be selected as well as one of the delay elements 701_1 to 701_n can be selected. In the case of selecting a plurality of the delay elements 701_1 to 701_n, the delay elements can be randomly selected, therefore the propagation delay time can be set in details with less delay elements as compared to the variable delay circuits shown in FIGS. 2 and 6.

In the case where all the switching elements 702_1 to 702_n select input sides of each of the delay elements 701_1 to 701_n, for example, all the delay elements 701_1 to 701_n are not selected. In this case, therefore, the propagation delay time $_0$ ideally becomes 0. In the case where only the switching element 702_1 selects an output side of the corresponding delay element 701_1, the delay element 701_1 only is selected, thus the propagation delay time $d_1$ ideally becomes $\sigma_1$. In the case where only the switching elements 702_1 and 702_3 select output sides of the corresponding delay circuits 701_1 and 701_3, the delay elements 701_1 and 701_3 only are selected, thus the propagation delay time $d_5$ ideally becomes $\sigma_1+\sigma_3$.

In this manner, controlling the selections of the switching elements 702_1 to 702_n can control the propagation delay time to be $d_0$ to $d_k$ as shown in Chart 3 below. In this case, the propagation delay time of $2^n$ stages can be set by satisfying $\sigma_1: \sigma_2: \sigma_3: \ldots :\sigma_n = 2^0:2^1:2^2:\ldots:2^{n-1}$.

CHART 3

| | |
|---|---|
| $d_0$ | 0 |
| $d_1$ | $\sigma_1$ |
| $d_2$ | $\sigma_2$ |
| $d_3$ | $\sigma_1+\sigma_2$ |
| $d_4$ | $\sigma_3$ |
| $d_5$ | $\sigma_1+\sigma_3$ |
| $d_6$ | $\sigma_2+\sigma_3$ |
| $d_7$ | $\sigma_1+\sigma_2+\sigma_3$ |
| . | . |
| . | . |
| . | . |
| $d_k$ | $\sigma_1+\sigma_2+\sigma_3+\ldots+\sigma_n$ |

Embodiment 3

Next, FIG. 8 shows a specific circuit configuration as an example in which three delay elements are provided (n=3) in the variable delay circuit 200 shown in FIG. 2. In FIG. 8, the selector 203 and the delay elements 201_1 to 201_3 only are shown.

In FIG. 8, the delay elements 201_1 to 201_3 each has three buffers 210. Note that the number of buffers used in the delay elements 201_1 to 201_3 is not limited to three and one or a plurality of buffers other than three may be provided as well. Moreover, an element used for the delay elements 201_1 to 201_3 is not limited to a buffer and it may be other elements such as an inverter and a resistor. In this embodiment, the same numbers of buffers are used for each of the delay elements 201_1 to 201_3, however, different numbers of buffers may be provided as well.

The selector 203 includes the switching elements 202_1 to 202_4 each having a transmission gate, and inverters 220_1 to 220_4 corresponding to each of the switching elements 202_1 to 202_4. A select signal decoded by the decoder 204 and a signal which is the select signal inverted by the inverters 220_1 to 220_4 control the switching elements 202_1 to 202_4, thus the delay elements 201_1 to 201_3 are selected.

It is assumed that propagation delay time generated by the delay element 201_1, the delay element 201_2, and the delay element 201_3 are $\sigma_1$, $\sigma_2$, and $\sigma_3$ respectively and propagation delay time generated by each buffer 210 is all d. In this case, $\sigma_1=\sigma_2=\sigma_3=3d$ is satisfied. In accordance with Chart 3, the propagation delay time can be set as $d_0=0$, $d=3d$, $d_2=6d$, and $d_3=9d$.

Embodiment 4

In this embodiment, a configuration of a CPU which is one of the semiconductor devices of the invention is described.

FIG. 9 shows a configuration of a CPU of this embodiment. The CPU shown in FIG. 9 mainly includes an arithmetic circuit (ALU: Arithmetic Logic Unit) 901, an ALU Controller 902, an Instruction Decoder 903, an Interrupt Controller 904, a Timing Controller 905, a Register 906, a Register Controller 907, a Bus Interface (Bus I/F) 908, a rewritable ROM 909, and a ROM interface (ROM I/F) 920 on a substrate 900. The ROM 909 and the ROM I/F 920 may be provided as separate chips. It is needless to say that the CPU shown in FIG. 9 is only an example showing the configuration simply and an actual CPU has various kinds of configurations according to the applications.

An instruction inputted to the CPU through the Bus I/F 908 is inputted to the Instruction Decoder 903 to be decoded, and inputted to the ALU Controller 902, the Interrupt Controller 904, the Register Controller 907, and the Timing Controller 905.

The ALU Controller 902, the Interrupt Controller 904, the Register Controller 907, and the Timing Controller 905 perform various control operations based on the decoded instructions. In specific, the ALU Controller 902 generates a signal for controlling the operation of the ALU 901. Further, the Interrupt Controller 904 determines and processes an interrupt request from an external input/output device and peripheral circuitry during program execution of the CPU according to the priority and a condition of a mask. The Register Controller 907 generates an address of the Register 906 and reads out and writes into the Register 906 according to the state of the CPU.

Moreover, the Timing Controller 905 generates a signal for controlling the operating timing of the ALU 901, the ALU Controller 902, the Instruction Decoder 903, the Interrupt Controller 904, the Register Controller 907, and the Bus I/F 908. The Timing Controller 905, for example, is provided with an internal clock generating portion which generates an internal clock signal $CLK_2$ based on a reference clock signal $CLK_1$ and supplies the clock signal $CLK_2$ to the aforementioned various circuits.

In the CPU of this embodiment, variable delay circuits 910 to 915 for compensating a delay of the clock signal $CLK_2$ supplied from the Timing Controller 905 are provided for the ALU 901, the ALU Controller 902, the Instruction Decoder 903, the Interrupt Controller 904, the Register Controller 907, and the Bus I/F 908.

A setting of each of the variable delay circuits is read out from the ROM 909 by the ROM I/F 920 right after or as a part of the reset operation and then written to a register in each of the variable delay circuits. This operation is an operation before the CPU is activated, and the CPU starts reading in initial instructions after the setting of each of the variable delay circuits terminates. Note that an initial value of a register in each variable delay circuit initialized by a reset signal may be set as an expected value which is estimated in the design phase. In the case where a variation of clock signals can be suppressed within an acceptable value in the manufacture of a chip, initialization by a reset signal only is required to enable the operation.

The setting of the variable delay circuit by the ROM I/F 920 is independent of an original operation of the CPU, therefore, a clock signal supplied to the ROM I/F 920 is not required to be identical to a clock signal supplied to other blocks of the CPU. The setting of the variable delay circuit by the ROM I/F 920 is, for example, performed once early in a reset operation, therefore, not a fast clock signal of which design margin is narrow but a comparatively slow clock signal which provides an operation accurately may be generated by the Timing Controller 905 to be used. Further, an input terminal of a clock signal may be of a separate system as well.

By providing the variable delay circuits 910 to 915, a CPU can operate on a desired condition even when a variation is generated in the propagation delay of the internal clock signal $CLK_2$. Note that not all the variable delay circuits 910 and 915 are required to be provided. Such a structure may be employed that the variable delay circuit is provided in a preceding stage of a circuit of which variation of the propagation delay is large.

In this embodiment, a CPU is taken as an example, however, the semiconductor device of the invention is not limited to a CPU.

Embodiment 5

Electronic apparatuses using the semiconductor device of the invention include a video camera, a digital camera, a goggle type display (a head mounted display), a navigation system, an audio reproducing apparatus (a car audio set, an audio component system and the like), a notebook personal computer, a game machine, a portable information terminal (a mobile computer, a portable phone, a portable game machine, an electronic book or the like), an image reproducing apparatus provided with a recording medium (specifically, an apparatus which reproduces a recording medium such as a DVD: Digital Versatile Disc and has a display capable of displaying the reproduced image) and the like. Specific examples of these electronic apparatuses are shown in FIG. 10.

FIG. 10A illustrates a portable information terminal including a main body 2001, a display portion 2002, an operating key 2003, a modem 2004 and the like. FIG. 10A shows a portable information terminal that the modem 2004 is demountable, however, the modem may be incorporated in the main body 2001. The semiconductor device of the invention can be used in a signal processing circuit of the portable information terminal.

FIG. 10B illustrates a portable phone including a main body 2101, a display portion 2102, an audio input portion 2103, an audio output portion 2104, an operating key 2105, an external connecting port 2106, an antenna 2107 and the like. Note that current consumption of the portable phone can be suppressed by displaying white text on a black background on the display portion 2102. The semiconductor device of the invention can be used in a signal processing circuit of the portable phone.

FIG. 10C illustrates an electronic card including a main body 2201, a display portion 2202, a connecting terminal 2203 and the like. The semiconductor device of the invention can be used in a signal processing circuit of the electronic card. FIG. 10C illustrates a contact type electronic card, however, the semiconductor device of the invention can be used in a non-contact type electronic card or an electronic card operating both with and without contact.

FIG. 10D illustrates an electronic book including a main body 2301, a display portion 2302, an operating key 2303 and the like. A modem may be incorporated in the main body 2301. The semiconductor device of the invention can be used in a signal processing circuit of the electronic book.

FIG. 10E illustrates a sheet type personal computer including a main body 2401, a display portion 2402, a keyboard 2403, a touch pad 2404, an external connecting port 2405, a power plug 2406 and the like. The semiconductor device of the invention can be used in a signal processing circuit of the sheet type personal computer.

As described above, an application range of the invention is quite wide and can be applied to electronic apparatuses of various fields. The electronic apparatuses of this embodiment can employ a semiconductor device having any of the structures described in Embodiments 1 to 4.

The invention claimed is:

1. A semiconductor device comprising:
   a first variable delay circuit;
   a first circuit to which a first signal outputted from the first variable delay circuit is inputted;
   a second variable delay circuit; and
   a second circuit to which a second signal outputted from the second variable delay circuit is inputted,
   wherein the first variable delay circuit comprises at least one delay element, a first selector including a first switching element and a second switching element, a second selector including a third switching element and a fourth switching element, a first decoder for selecting one of the first switching element and the second switching element and a second decoder for selecting one of the third switching element and the fourth switching element,
   wherein an input terminal of the first variable delay circuit is connectable to an output terminal of the first variable delay circuit through the first switching element and the third switching element or through the second switching element, the delay element and the fourth switching element in accordance with a signal of the first decoder and a signal of the second decoder,
   wherein the first signal and the second signal which are divided from a single signal is inputted to each of the first variable delay circuit and the second variable delay circuit, and
   wherein a difference between a phase of the first signal outputted from the first variable delay circuit and a phase of the single signal is smaller than a difference between a phase of the first signal to be inputted to the first variable delay circuit and a phase of the single signal.

2. The semiconductor device according to claim 1,
   wherein the delay element is a buffer, an inverter, or a resistor.

3. A semiconductor device according to claim 1,
   wherein the first circuit, the second circuit, the first variable delay circuit and the second variable delay circuit are provided over a same substrate.

4. A semiconductor device according to claim 1, wherein the semiconductor device is incorporated in an electronic apparatus selected from the group consisting of a camera, a head mounted display, a navigation system, an audio reproducing apparatus, a personal computer, a game machine, a portable information terminal, and an image reproducing device.

5. A semiconductor device comprising:
- a first variable delay circuit;
- a first circuit to which a first signal outputted from the first variable delay circuit is inputted;
- a second variable delay circuit; and
- a second circuit to which a second signal outputted from the second variable delay circuit is inputted,
- wherein the first variable delay circuit comprises a first delay element, a second delay element, a first selector including a first switching element, a second switching element and a third switching element, a second selector including a fourth switching element, a fifth switching element and a sixth switching element, a first decoder for selecting one of the first switching element, the second switching element and the third switching element and a second decoder for selecting one of the fourth switching element, the fifth switching element and the sixth switching element,
- wherein an input terminal of the first variable delay circuit is connectable to an output terminal of the first variable delay circuit through the first switching element and the fourth switching element, through the second switching element, the first delay element and the fifth switching element or through the third switching element, the second delay element and the sixth switching element in accordance with a signal of the first decoder and a signal of the second decoder,
- wherein the first signal and the second signal which are divided from a single signal is inputted to each of the first variable delay circuit and the second variable delay circuit, and
- wherein a difference between a phase of the first signal outputted from the first variable delay circuit and a phase of the single signal is smaller than a difference between a phase of the first signal to be inputted to the first variable delay circuit and a phase of the single signal.

6. The semiconductor device according to claim 5,
- wherein at least one of the first delay element and the second delay element is a buffer, an inverter, or a resistor.

7. A semiconductor device according to claim 5,
- wherein the first circuit, the second circuit, the first variable delay circuit and the second variable delay circuit are provided over a same substrate.

8. A semiconductor device according to claim 5, wherein the semiconductor device is incorporated in an electronic apparatus selected from the group consisting of a camera, a head mounted display, a navigation system, an audio reproducing apparatus, a personal computer, a game machine, a portable information terminal, and an image reproducing device.

9. A semiconductor device comprising:
- a first variable delay circuit;
- a first circuit to which a first signal outputted from the first variable delay circuit is inputted;
- a second variable delay circuit; and
- a second circuit to which a second signal outputted from the second variable delay circuit is inputted,
- wherein the first variable delay circuit comprises at least one delay element, a first selector including a first switching element and a second switching element, a second selector including a third switching element and a fourth switching element, a first decoder for selecting one of the first switching element and the second switching element and a second decoder for selecting one of the third switching element and the fourth switching element,
- wherein an input terminal of the first variable delay circuit is connectable to an output terminal of the first variable delay circuit through the first switching element and the third switching element or through the second switching element, the delay element and the fourth switching element in accordance with a signal of the first decoder and a signal of the second decoder,
- wherein the first signal and the second signal which are divided from a single signal is inputted to each of the first variable delay circuit and the second variable delay circuit,
- wherein a phase of the first signal to be inputted to the first variable delay circuit is different from a phase of the single signal, and
- wherein a phase of the first signal outputted from the first variable delay circuit and a phase of the single signal are identical to each other.

10. The semiconductor device according to claim 9,
- wherein the delay element is a buffer, an inverter, or a resistor.

11. A semiconductor device according to claim 9,
- wherein the first circuit, the second circuit, the first variable delay circuit and the second variable delay circuit are provided over a same substrate.

12. A semiconductor device according to claim 9, wherein the semiconductor device is incorporated in an electronic apparatus selected from the group consisting of a camera, a head mounted display, a navigation system, an audio reproducing apparatus, a personal computer, a game machine, a portable information terminal, and an image reproducing device.

13. A semiconductor device comprising:
- a first variable delay circuit;
- a first circuit to which a first signal outputted from the first variable delay circuit is inputted;
- a second variable delay circuit; and
- a second circuit to which a second signal outputted from the second variable delay circuit is inputted,
- wherein the first variable delay circuit comprises a first delay element, a second delay element, a first selector including a first switching element, a second switching element and a third switching element, a second selector including a fourth switching element, a fifth switching element and a sixth switching element, a first decoder for selecting one of the first switching element, the second switching element and the third switching element and a second decoder for selecting one of the fourth switching element, the fifth switching element and the sixth switching element,
- wherein an input terminal of the first variable delay circuit is connectable to an output terminal of the first variable delay circuit through the first switching element and the fourth switching element, through the second switching element, the first delay element and the fifth switching element or through the third switching element, the second delay element and the sixth switching element in accordance with a signal of the first decoder and a signal of the second decoder,
- wherein the first signal and the second signal which are divided from a single signal is inputted to each of the first variable delay circuit and the second variable delay circuit, wherein a phase of the first signal to be inputted to the first variable delay circuit is different from a phase of the single signal, and wherein a phase of the first signal outputted from the first variable delay circuit and a phase of the single signal are identical to each other.

14. The semiconductor device according to claim 13,
wherein at least one of the first delay element and the second delay element is a buffer, an inverter, or a resistor.

15. A semiconductor device according to claim 13,
wherein the first circuit, the second circuit, the first variable delay circuit and the second variable delay circuit are provided over a same substrate.

16. A semiconductor device according to claim 13, wherein the semiconductor device is incorporated in an electronic apparatus selected from the group consisting of a camera, a head mounted display, a navigation system, an audio reproducing apparatus, a personal computer, a game machine, a portable information terminal, and an image reproducing device.

17. A semiconductor device comprising:
a first variable delay circuit;
a first circuit to which a first signal outputted from the first variable delay circuit is inputted;
a second variable delay circuit; and
a second circuit to which a second signal outputted from the second variable delay circuit is inputted,
wherein the first variable delay circuit comprises at least one delay element, a first selector including a first switching element and a second switching element, a second selector including a third switching element and a fourth switching element, a first decoder for selecting one of the first switching element and the second switching element and a second decoder for selecting one of the third switching element and the fourth switching element, and
wherein an input terminal of the first variable delay circuit is connectable to an output terminal of the first variable delay circuit through the first switching element and the third switching element or through the second switching element, the delay element and the fourth switching element in accordance with a signal of the first decoder and a signal of the second decoder.

18. The semiconductor device according to claim 17,
wherein the delay element is a buffer, an inverter, or a resistor.

19. A semiconductor device according to claim 17,
wherein the first circuit, the second circuit, the first variable delay circuit and the second variable delay circuit are provided over a same substrate.

20. A semiconductor device according to claim 17, wherein the semiconductor device is incorporated in an electronic apparatus selected from the group consisting of a camera, a head mounted display, a navigation system, an audio reproducing apparatus, a personal computer, a game machine, a portable information terminal, and an image reproducing device.

21. A semiconductor device comprising:
a first variable delay circuit;
a first circuit to which a first signal outputted from the first variable delay circuit is inputted;
a second variable delay circuit; and
a second circuit to which a second signal outputted from the second variable delay circuit is inputted,
wherein the first variable delay circuit comprises a first delay element, a second delay element, a first selector including a first switching element, a second switching element and a third switching element, a second selector including a fourth switching element, a fifth switching element and a sixth switching element, a first decoder for selecting one of the first switching element, the second switching element and the third switching element and a second decoder for selecting one of the fourth switching element, the fifth switching element and the sixth switching element, and
wherein an input terminal of the first variable delay circuit is connectable to an output terminal of the first variable delay circuit through the first switching element and the fourth switching element, through the second switching element, the first delay element and the fifth switching element or through the third switching element, the second delay element and the sixth switching element in accordance with a signal of the first decoder and a signal of the second decoder.

22. The semiconductor device according to claim 21,
wherein at least one of the first delay element and the second delay element is a buffer, an inverter, or a resistor.

23. A semiconductor device according to claim 21,
wherein the first circuit, the second circuit, the first variable delay circuit and the second variable delay circuit are provided over a same substrate.

24. A semiconductor device according to claim 21, wherein the semiconductor device is incorporated in an electronic apparatus selected from the group consisting of a camera, a head mounted display, a navigation system, an audio reproducing apparatus, a personal computer, a game machine, a portable information terminal, and an image reproducing device.

* * * * *